United States Patent
Watabe et al.

[11] Patent Number: 5,414,281
[45] Date of Patent: May 9, 1995

[54] SEMICONDUCTOR LIGHT EMITTING ELEMENT WITH REFLECTING LAYERS

[75] Inventors: Shinichi Watabe; Tadatomo Kazuyuki; Hiroaki Okagawa, all of Itami, Japan

[73] Assignee: Mitsubishi Cable Industries, Ltd., Hyogo, Japan

[21] Appl. No.: 111,508

[22] Filed: Aug. 25, 1993

[30] Foreign Application Priority Data

Aug. 25, 1992 [JP] Japan .................................. 4-226189

[51] Int. Cl.⁶ ............................................. H01L 33/00
[52] U.S. Cl. ....................................... 257/95; 257/96; 257/97; 257/98; 372/50; 372/99
[58] Field of Search ................... 257/94, 95, 97, 98, 257/103, 99; 372/99, 50, 49

[56] References Cited

U.S. PATENT DOCUMENTS

| | | | |
|---|---|---|---|
| 4,766,470 | 8/1988 | Scholl et al. | 257/98 X |
| 5,132,750 | 7/1992 | Kato et al. | 257/98 X |
| 5,289,018 | 2/1994 | Okuda et al. | 257/98 |

FOREIGN PATENT DOCUMENTS

| | | | |
|---|---|---|---|
| 57-48383 | 9/1982 | Japan | 257/98 |
| 63-81873 | 4/1988 | Japan | 257/98 |
| 1137679 | 5/1989 | Japan | 257/98 |
| 1021327 | 3/1966 | United Kingdom | |
| 8503809 | 8/1985 | WIPO | |

*Primary Examiner*—William Mintel
*Attorney, Agent, or Firm*—Sughrue, Mion, Zinn, Macpeak & Seas

[57] ABSTRACT

A semiconductor light emitting element comprising a semiconductor substrate having a lower electrode on its back, a pn junction, a first light reflecting layer disposed between the substrate and the pn junction, an upper electrode, and a second light reflecting layer disposed between the pn junction and the upper electrode, the second light reflecting layer being capable of substantially reflecting the light heading toward the upper electrode, which preferably has, between the pn junction and the second light reflecting layer, a semiconductor layer having a wider bandgap than that of a light emitting layer formed by said pn junction. The semiconductor light emitting element of the invention is advantageous in that the light absorption in the upper electrode can be inhibited to permit efficient output of the light heading toward the upper electrode from the element, and luminance can be greatly increased by the effective output of the light from the element.

10 Claims, 4 Drawing Sheets

↑
H 1

↑
H 2

SEMICONDUCTOR LIGHT EMITTING ELEMENT WITH REFLECTING LAYERS

TECHNICAL FIELD OF THE INVENTION

The present invention relates to a semiconductor light emitting element. More particularly, the invention relates to a semiconductor light emitting element having a high luminance such as a light emitting diode (LED), which permits efficient output of emitted light by avoiding absorption of the light in an upper electrode.

BACKGROUND OF THE INVENTION

So as to improve the luminance of surface radiation type semiconductor light emitting elements such as an LED, there have been recently developed double heterostructure semiconductor light emitting elements wherein a Bragg light reflecting layer has been disposed between a pn junction and a substrate such that the light emitted at the pn junction which goes toward the substrate is reflected by the Bragg light reflecting layer toward a light output surface so that the light is efficiently radiated from the output surface.

FIG. 7 shows a cross section of a conventional semiconductor light emitting element as described, wherein H is a semiconductor light emitting element composed of a plate Bragg light reflecting layer 2, the first conductivity type semiconductor cladding layer 3, a semiconductor active layer 4, and the second conductivity type semiconductor cladding layer 5 successively formed on the first conductivity type semiconductor substrate 1, all of which having a thickness of the order of from 0.01 to several dozen μm.

In the semiconductor light emitting element H, a pn junction X to be a light emitter is formed by the first conductivity type semiconductor cladding layer 3 and the semiconductor active layer 4, and an upper electrode 6 is formed on the surface A of the second conductivity type semiconductor cladding layer 5 (i.e. light output surface); a lower electrode 7 is formed beneath the substrate 1.

A flow of driving current between the upper electrode 6 and the lower electrode 7 starts the emission of light at the pn junction X. The light heading toward the light output surface A is radiated from the output surface A. The light heading toward the substrate 1 is reflected back to the light output surface A by the plate light reflecting layer 2, and also radiated from the output surface A.

Consequently, luminance of the semiconductor light emitting element H can be improved, since the light emitted at the pn junction X is not absorbed in the substrate 1, but can be radiated from the element.

However, the light heading toward the light output surface A is absorbed in the upper electrode 6 on the output surface A, which reduces the amount of light to be radiated from the light emitting element, thus resulting in failure to sufficiently improve the luminance of the semiconductor light emitting element H.

As such, there is still a limitation in improving the luminance of a semiconductor light emitting element of this structure having a light reflecting layer interposed between the substrate and the pn junction, and the development of a light emitting element with higher luminance has been desired. While many attempts have been made to incorporate various improvements so as to meet the need of the market, none of them have ever successfully achieved the goal of providing a light emitting element with a higher luminance.

Accordingly, an object of the invention is to provide a semiconductor light emitting element permitting efficient output of the light emitted at the pn junction, whereby to increase the luminance of a semiconductor light emitting element such as an LED.

SUMMARY OF THE INVENTION

The semiconductor light emitting element which accomplishes the above-mentioned object comprises a semiconductor substrate having a lower electrode beneath it, a pn junction, a first light reflecting layer to be disposed between the substrate and the pn junction, an upper electrode, and a second light reflecting layer to be disposed between the pn junction and the upper electrode to reflect the light heading toward the upper electrode, and preferably further comprises, between the pn junction and the second light reflecting layer, a semiconductor layer having a wider bandgap than does the light emitting layer.

DETAILED DESCRIPTION OF THE INVENTION

The semiconductor light emitting element of the present invention is characterized in that a second light reflecting layer is formed in between a pn junction and an upper electrode of a conventional semiconductor light emitting element comprising a pn junction, a substrate, and a light reflecting layer formed therebetween.

Figure 1:
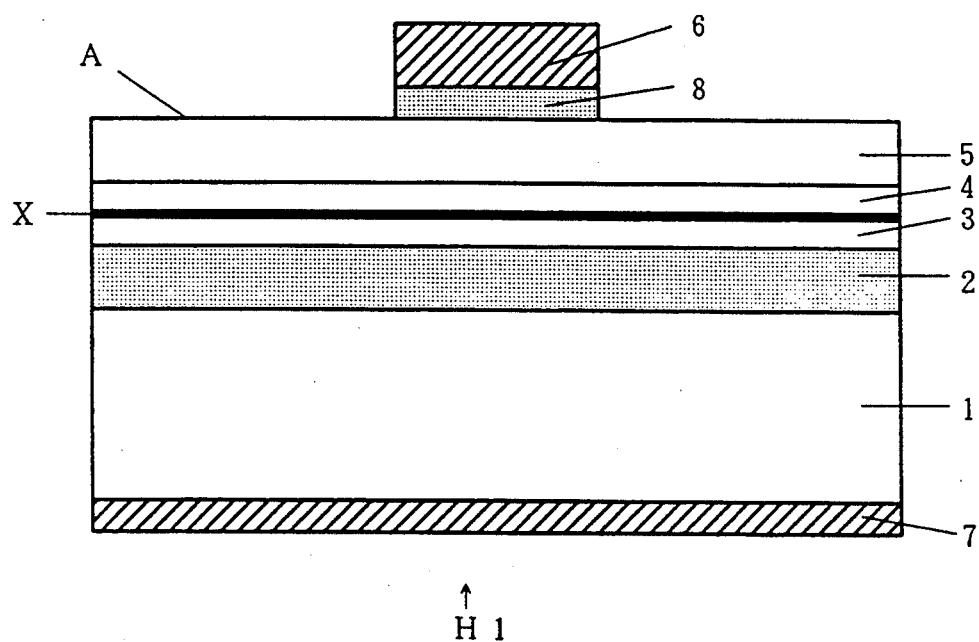
FIG. 1 is a schematic representation of the cross section of a semiconductor light emitting element according to one embodiment of the invention.
Figure 7:
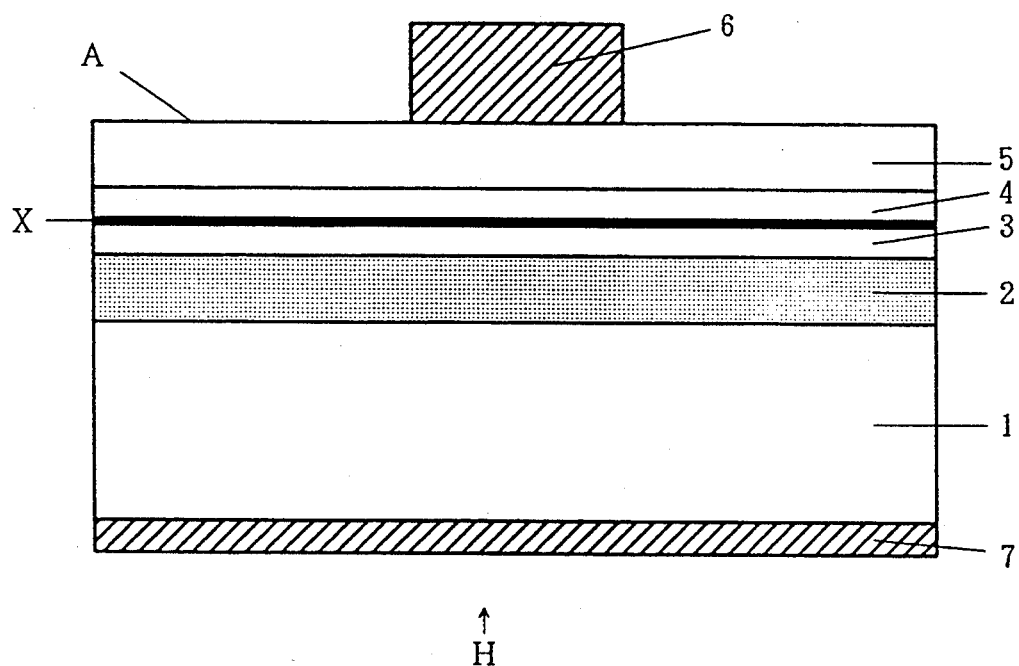
FIG. 7 is a schematic representation of the cross section of a conventional semiconductor light emitting element.

FIG. 1 schematically shows a cross section of the semiconductor light emitting element of the present invention. Throughout the following description, the reference characters used in FIG. 7 are also used for the identical parts of other semiconductor light emitting elements. In FIG. 1, the semiconductor light emitting element H1 is composed of a light reflecting layer 2, a semiconductor cladding layer 3, a semiconductor active layer 4, and semiconductor cladding layer 5 sequentially deposited on a semiconductor substrate 1.

In said semiconductor light emitting element H1, the cladding layer 3 and the active layer 4 form a pn junction X to be a light emitter; an upper electrode 6 is provided on a light output surface A of the semiconductor cladding layer 5; a lower electrode 7 is provided beneath the substrate 1; and a second light reflecting layer 8 is formed right beneath the upper electrode 6 between the light output surface A and the upper electrode.

With this structure of the semiconductor light emitting element H1, when the pn junction X emits light, the light heading toward the output surface A is radiated from the output surface A. On the other hand, the light heading toward the substrate 1 is reflected by the plate light reflecting layer 2 back to the light output surface A, and also radiated from the output surface A. A part of the light heading toward the output surface A advances toward the upper electrode 6 on the light output surface A, but is reflected by the second light reflecting layer provided beneath the upper electrode 6, whereby absorption of the light in the upper electrode 6 can be prevented. Consequently, the light emitted at the pn junction X can be radiated from the semiconductor light emitting element H1 without wasting and the luminance of the element can be increased.

In the present invention, no particular limitation is imposed on the semiconductor material for the substrate, and those usually employed as the substrate materials for an LED, etc. may be preferably used. Examples of them include various p-type and n-type semiconductors of InP, GaAs, GaP, AlGaAs, GaInP, and GaInAs.

The first light reflecting layer 2 to be formed on the substrate 1 may be any layer insofar as it is capable of substantially reflecting the light emitted at the pn junction X. Yet, it is preferable that the layer 2 has a widest possible reflection wavelength band, since full width at half maximum of the emission spectrum of LEDs which utilize spontaneously emitted light is mostly about 30–80 meV, which means that the emission wavelength has a certain width.

Examples of the light reflecting layer include Bragg a reflecting layer having a multilayer structure involving two or more materials having different refractive indices, and reflecting layers made of conductive semiconductor materials or insulating films, which have a multitude of pores so as to maintain electrical continuity, with preference given to Bragg a reflecting layer which can be formed in the process of epitaxial growth such as MOCVD, and permits easy control over film thickness.

The Bragg reflecting layer is composed of a pair of a layer having a specific refractive index n and a thickness d ($d=\lambda/4n$ wherein $\lambda$ is a central emission wavelength of the light emitting layer) and another layer having a different refractive index, which are laminated one on the other. In order to improve reflectance, it is only needed to comprise two or more of the above-mentioned pairs in the reflecting layer; in order to widen the reflection band, it is only needed to comprise two or more pairs having different refractive index from that of the above-mentioned pair, or to comprise two or more pairs having different thicknesses. In general, the Bragg reflecting layer comprises about 2–200 pairs, usually 4–60 pairs of the above-mentioned laminated layers. When comprising pairs having different thickness, it is preferable that the reflecting layer is formed in such a manner that the central wavelength $\lambda$ gradually becomes longer with the increasing distance from the light emitting part.

The Bragg reflecting layer of the above structure reflects light due to the wavelength selectivity to reflect the light of a specific wavelength at a maximum reflectance, i.e. light interference.

To be specific, a pair of or two or more pairs of, for example, GaAs (refractive index being 3.65) and $Ga_{0.5}Al_{0.5}As$ (refractive index being 3.42) formed as GaAs (thickness being 43 nm)/$Ga_{0.5}Al_{0.5}As$ (thickness being 46 nm) can afford a 630 nm band light reflecting layer.

When using a GaAs substrate, AlGaInP, GaInP and/or AlGaAs can be used for the cladding layers 3 and 5, and the active layer 4 to be formed on the above-mentioned first light reflecting layer 2. When a GaP substrate is used, AlGaP can be used; when an InP substrate is used, InGaAsP can be used; when a GaN substrate is used, AlGaN can be used. Furthermore, ZnSeS, ZnCdSe and/or MgZnSeS may be grown on a GaP substrate or GaAs substrate by MBE, etc.

In the above-mentioned construction, the top surface of the cladding layer 5 becomes the light output surface of the semiconductor light emitting element.

The second light reflecting layer 8 is formed between said light output surface A and the upper electrode 6. The second light reflecting layer 8 may be of any shape or size if it successfully reflects the light going toward the upper electrode 6 from among the light directed to the light output surface A. It may be somewhat larger or smaller than the bottom area of the upper electrode 6. That of almost the same plane size with the upper electrode 6, which is located right beneath the upper electrode 6, preferably ensures reliable reflection of the light toward the upper electrode 6.

The second light reflecting layer is formed in the same manner as in the case of the first light reflecting layer.

The light reflecting layer and the semiconductor layer are produced by an epitaxial growth of respective materials on a semiconductor substrate. The method for the epitaxial growth is, for example, MOCVD, MBE, or LPE conventionally known.

The upper electrode 6 is formed on the second light reflecting layer. The lower electrode 7 is formed on the back of the semiconductor substrate.

The materials for the electrode include, for example, AuBe, AuSn, AuGe, and AuZn, which may be prepared into an electrode by vacuum evaporation, sputtering, or the like.

The structure of the semiconductor light emitting element of the present invention may be Homo-type, single hetero (SH)-type, double hetero (DH)-type, or quantum-well structure. The DH type is particularly preferable in that the cladding layers formed on and beneath the active layer to form light emitting parts do not absorb the light, with the result that the injected carrier is effectively confined to improve radiative efficiency, which in turn increases luminance of the light emitting element.

Figure 3:
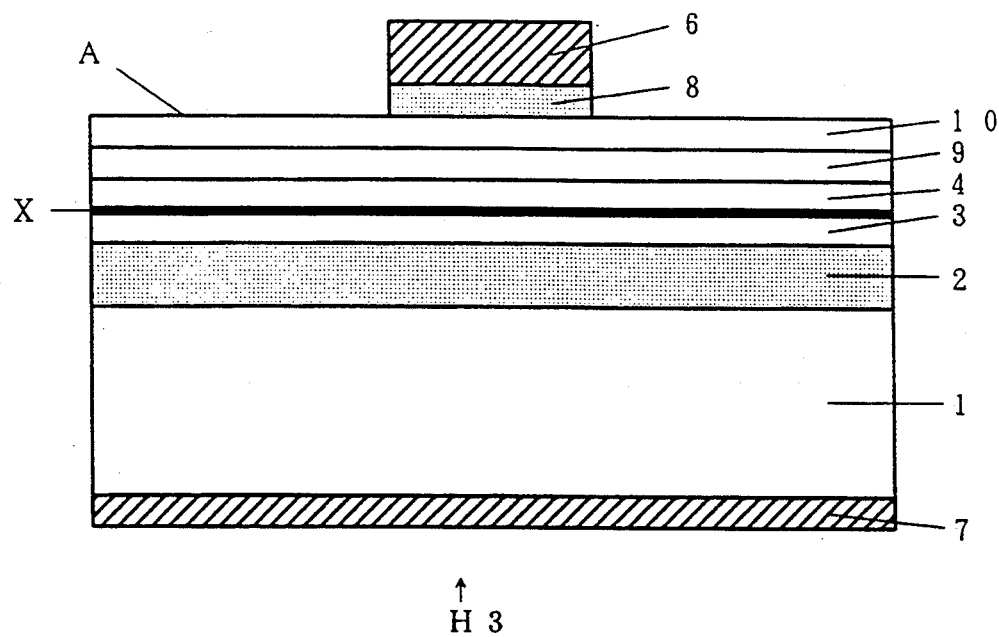
FIG. 3 is a schematic representation of the cross section of a semiconductor light emitting element according to still another embodiment of the invention.

In the present invention, a compound semiconductor layer (current diffusion layer) 10 having a wider bandgap with respect to the bandgap of the active layer, which does not absorb the emitted light, may be interposed between the cladding layer 9 and the second light reflecting layer 8, as schematically shown in FIG. 3. As the compound semiconductor, usable are known III-V group compounds (e.g. GaAs, GaP, InP, GaAlAs, GaAlP), IV—IV group compounds (e.g. SiC), and I-III-$VI_2$ group compounds (e.g. $CuInSe_2$, $CuGaSe_2$, $AgGuS_2$), and known CVD, LPE, MBE, ALE, MOVPE, or the like can produce a layer 10.

With this construction involving the above-mentioned compound semiconductor layer 10, the current which flows in from the upper electrode 6 effectively spreads throughout the pn junction X to cause light emission in the entirety of the pn junction, and a lowered radiative efficiency caused by the partial injection of carrier into the active layer 4 when the cladding layer 9 is thin, can be overcome.

Optionally, this compound semiconductor layer may be used as a substrate, on which a pn junction and a first light reflecting layer are grown, and on the opposite side of which a second light reflecting layer is grown. Then, an electrode is provided on each side to afford a light emitting element.

As the above-mentioned semiconductor layer 10, GaP is particularly preferable in view of its properties permitting easy epitaxial growth and easy production of thick layers, and in view of it having a wider bandgap.

While the first and the second light reflecting layers of the present invention may have the shape of a plate, the light reflected by the above-mentioned first or second light reflecting layer may be retroreflected by the second or first light reflecting layer to cause light resonance phenomenon. It is therefore desirable to manufacture the reflecting layers such that the retroreflection is avoided.

Figure 4:
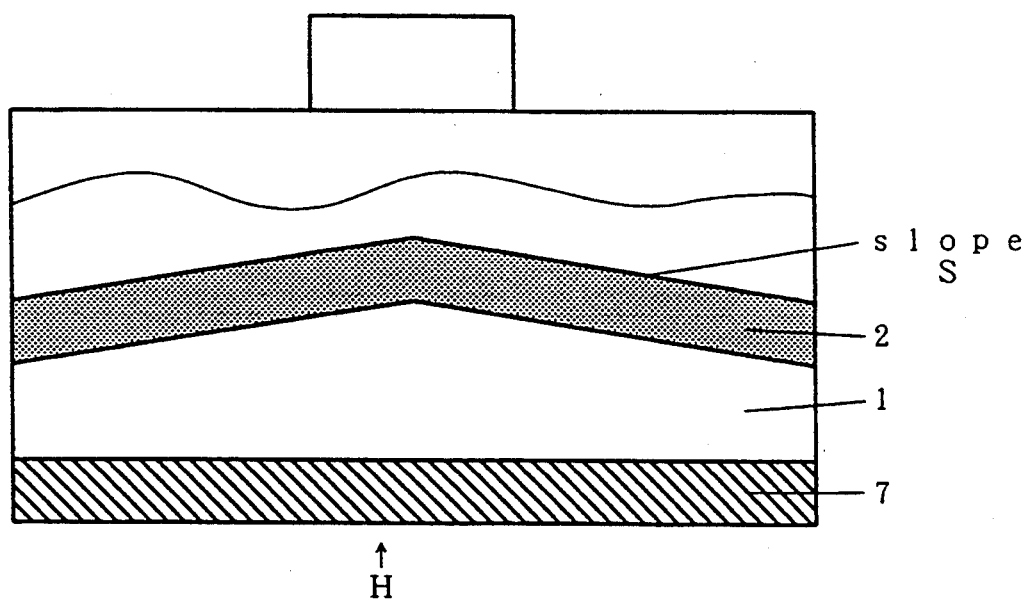
FIGS. 4–6 are schematic representations of the cross section with portions broken away for the sake of clarity, of the first light reflecting layers to be used for the semiconductor light emitting elements of the invention.
Figure 5:
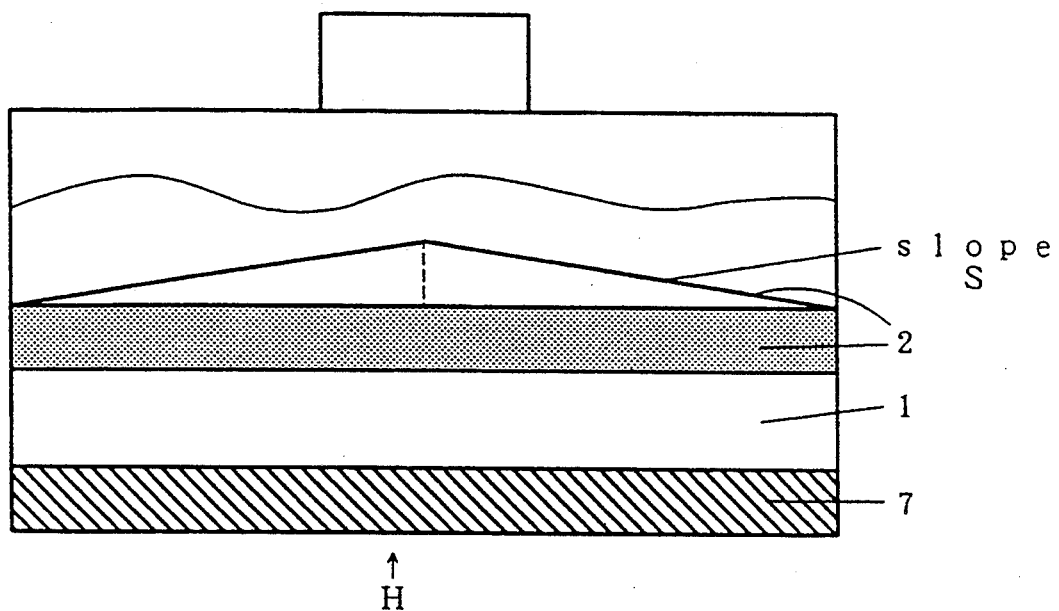
Figure 6:
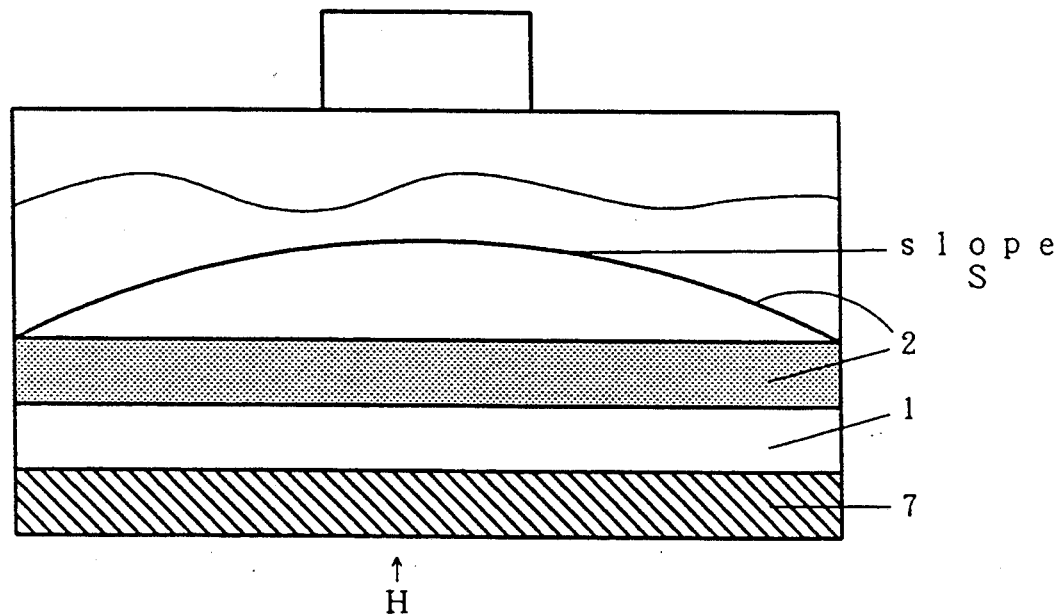

The light reflecting layer which can avoid retroreflection may have the shape of a plate if irregularities are formed on the surface, or that having a slope S, such as a gable roof as shown in FIG. 4, a pyramid as shown in FIG. 5, or a dome as shown in FIG. 6.

By taking such shape as exemplified, the light can be made not to retroreflect or cause light resonance phenomenon, thus resulting in efficient output of the light.

So as to prepare the above-mentioned three-dimensional light reflecting layer having a slope, a substrate for growth may be subjected to patterning by photolithography, and then to wet or dry anisotropic etching to process the substrate surface into a desired shape, or an epitaxial layer having a crystal face different from that of the substrate may be formed on the surface of the substrate by selective growth using MBE or MOCVD.

As detailedly described, the semiconductor light emitting element of the present invention certainly reflects the light heading toward the upper electrode to remarkably avoid absorption of the light in the upper electrode, while allowing efficient output of the light from the element.

By imparting a shape free of retroreflection to the light reflecting layer, light resonance between the first and the second light reflecting layers can be prohibited, whereby efficient output of the light from the element can be attained.

Moreover, a compound semiconductor layer having a wide bandgap which is formed between the light output surface and the second light reflecting layer can cause effective diffusion of the current to enlarge the light emitting area, with the effect that the light absorption in the upper electrode can be inhibited and the light can be efficiently radiated from the element.

Accordingly, the semiconductor light emitting element of the present invention successfully radiates the light emitted at the pn junction without wasting, and affords a markedly improved luminance as compared with conventional light emitting elements.

The present invention is hereinafter in more detail described by way of examples.

EXAMPLE 1

FIG. 1 schematically shows the structure of a semiconductor light emitting element according to one embodiment of the present invention. In the semiconductor light emitting element H1, an n-type first light reflecting layer 2 composed of laminated multiple pairs of a GaAs layer and an $Al_{0.45}Ga_{0.55}As$ layer, an n-AlGaInP cladding layer 3, a p-GaInP active layer 4, and a p-AlGaInP cladding layer 5 were successively formed on an n-GaAs substrate 1, with an upper electrode 6 made of AuBe being provided on the surface A (light output surface) of the cladding layer 5, via a p-type second light reflecting layer 8 having the same structure as that of the n-type first light reflecting layer 2; a lower electrode 7 made of AuSn being provided on the back of the n-GaAs substrate 1.

The semiconductor light emitting element H1 was manufactured as in the following. A 0.2 μm-thick n-GaAs buffer layer (not shown) was epitaxially grown on a 350 μm-thick n-GaAs substrate 1. Then, an n-type first light reflecting layer 2 was formed by alternatively laminating 20 pairs of GaAs and AlGaAs. In order to widen the reflection band, the thickness of the GaAs layer was changed in the range of from 44 to 49 nm, and that of the AlGaAs layer was changed in the range of from 48 to 53 nm. In a sequential manner, a 3 μm-thick n-AlGaInP cladding layer 3, a 1 μm-thick n-GaInP active layer 4, and a 10 μm-thick p-AlGaInP cladding layer 5 were grown on the n-type first light reflecting layer 2. The composition of each layer had been adjusted such that each layer showed lattice match to GaAs and the light emitting part had a bandgap corresponding to 650 nm. A 1.9 μm-thick p-type second light reflecting layer 8 having the same structure as that of the first light reflecting layer 2 was formed on the light output surface A of the p-AlGaInP cladding layer 5, and AuBe was vacuum-evaporated on the second light reflecting layer 8. Then, a patterning treatment and an etching treatment were sequentially applied to form a 100 μm-diameter round-shaped second light reflecting layer 8 and an upper electrode 6, approximately at the center of the light output surface A.

On the other hand, AuSn was vacuum-evaporated on the back of a wafer (substrate) to give a lower electrode 7. The wafer was diced into a chip to give a semiconductor light emitting element H having a 350 μm × 350 μm light output surface.

COMPARATIVE EXAMPLE 1

A semiconductor light emitting element of the structure as shown in FIG. 7 was manufactured in the same manner as in Example 1 except that the second light reflecting layer was not formed.

EXAMPLES 2–4

Semiconductor light emitting elements were manufactured in the same manner as in Example I except that the first light reflecting layer was made to have a three-dimensional shape with a slope S, such as a gable roof as shown in FIG. 4 (Example 2), a pyramid as shown in FIG. 5 (Example 3), or a dome as shown in FIG. 6 (Example 4).

The first light reflecting layer of the three-dimensional shape with a slope S was respectively prepared in the following manner. A substrate for growth was first subjected to patterning by photolithography, and then to wet or dry anisotropic etching to give a desired shape of the substrate surface. Alternatively, it may be prepared by growing an epitaxial layer having a different crystal face from that of the substrate, on the substrate surface by selective growth by MBE or MOCVD.

Light Emitting Test

A 20 mA current was flowed between the upper electrode and the lower electrode of each of the semiconductor light emitting elements obtained in Examples 1-4 and Comparative Example 1 to allow emission of the light. The luminance was determined using a luminance meter (Photometer Model 550-1, manufactured by EG&G), the results of which are given in Table 1.

TABLE 1

|  | Shape of first light reflecting layer | luminance (mcd) |
| --- | --- | --- |
| Example 1 | plate | 30.1 |
| Comp.Ex. 1 | plate | 20.3 |
| Example 2 | gable roof | 32.8 |
| Example 3 | pyramid | 34.8 |
| Example 4 | dome | 32.7 |

As is evident from Table 1, the semiconductor light emitting element of Examples 1-4 showed about 50% increase in luminance as compared with that of Comparative Example 1.

EXAMPLE 5

Figure 2:
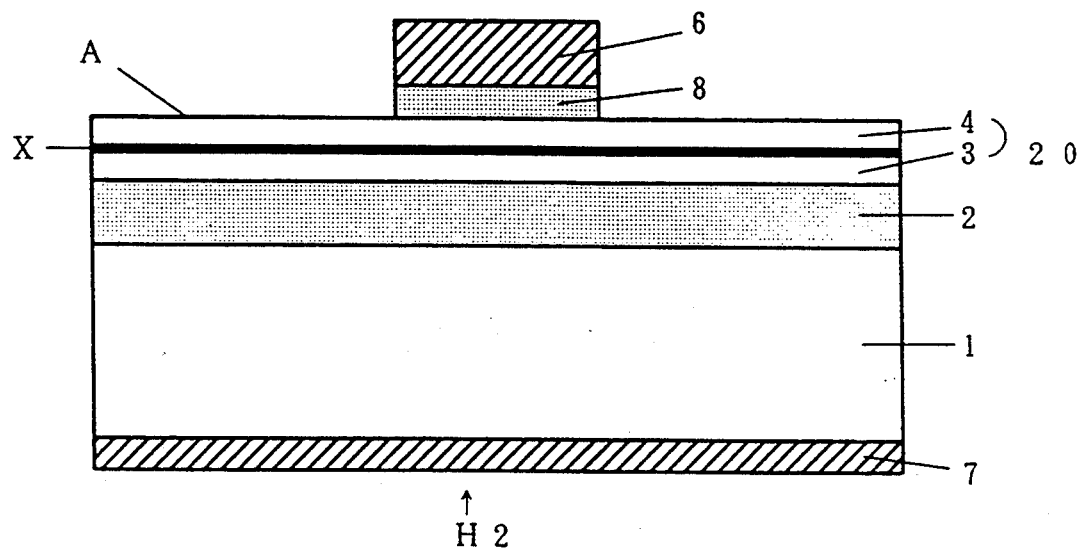
FIG. 2 is a schematic representation of the cross section of a semiconductor light emitting element according to another embodiment of the invention.

FIG. 2 schematically shows the structure of a Homo-type semiconductor light emitting element of another embodiment of the present invention. In this Homo-type semiconductor light emitting element H2, a GaAs buffer layer (not shown), an n-type first light reflecting layer 2 composed of laminated multiple pairs of an n-GaAs layer and an n-Al$_{0.45}$Ga$_{0.55}$As layer, an n-AlGaInP layer 3, and a p-AlGaInP layer 4 were sequentially formed on an n-GaAs substrate 1, with an upper electrode 6 made of AuBe being placed on the surface A (light output surface) of the p-type layer 4, via a p-type second light reflecting layer 8 having the same structure as that of the first light reflecting layer; a lower electrode 7 made of AuSn being formed on the back of the n-GaAs substrate 1.

The Homo-type semiconductor light emitting element H2 was manufactured as in the following. A 0.2 μm-thick n-GaAs buffer layer was epitaxially grown on a 350 μm-thick n-GaAs substrate 1. Then, the material gases for n-GaAs and n-Ga$_{0.3}$Al$_{0.7}$As were alternatively supplied onto the substrate 1 to form an n-type first light reflecting layer 2 composed of 22 laminated pairs of a GaAs layer having a thickness of 37-43 nm and a Ga$_{0.3}$Al$_{0.7}$As layer having a thickness of 41-47 nm. Thereafter, a 15 μm-thick InGaAlP layer 20 (3, 4) having a pn junction X at the center of the element, was formed. The composition of each layer had been adjusted such that each layer showed lattice match to GaAs and the light emitting part had a bandgap corresponding to 590 nm. An upper electrode 6 was provided via a p-type second light reflecting layer 8 having the same structure as that of the first light reflecting layer, and a lower electrode 7 was provided on the back of the substrate 1 in the same manner as in Example 1.

COMPARATIVE EXAMPLE 2

A semiconductor light emitting element was manufactured in the same manner as in Example 5 except that the second light reflecting layer was not formed.

EXAMPLES 6-8

Semiconductor light emitting elements were manufactured in the same manner as in Example 5 except that the first light reflecting layer was made to have a three-dimensional shape with a slope S, such as a gable roof (Example 6), a pyramid (Example 7), or a dome (Example 8).

The luminance of each element obtained was determined in the same manner as described above, the results of which are given in Table 2.

TABLE 2

|  | Shape of first light reflecting layer | luminance (mcd) |
| --- | --- | --- |
| Example 5 | plate | 18.5 |
| Comp.Ex. 2 | plate | 12.3 |
| Example 6 | gable roof | 18.9 |
| Example 7 | pyramid | 19.5 |
| Example 8 | dome | 18.1 |

As is evident from Table 2, the semiconductor light emitting element of Examples 5-8 showed about 50% increase in luminance as compared with that of Comparative Example 2.

EXAMPLE 9

The semiconductor light emitting element of this example was of an SH structure and had the same structure as shown in FIG. 2, which differed from the element of Example 5 in that the layer 4 was a p-AlGaP cladding layer, and layer 3 was an n-AlGaInP active layer.

The SH-type semiconductor light emitting element was manufactured in the same manner as in Example 5. That is, a 0.2 μm-thick n-GaAs buffer layer was epitaxially grown on a 350 μm-thick n-GaAs substrate. Then, an n-type first light reflecting layer composed of 18 pairs of an n-GaAs layer having a thickness of 37-43 nm and an n-Ga$_{0.3}$Al$_{0.7}$As layer having a thickness of 41-47 nm alternatively laminated, was formed. Thereafter, a 5 μm-thick InGaAlP layer was formed thereon. The composition of each layer had been adjusted such that each layer showed lattice match to GaAs and the light emitting layer had a bandgap corresponding to 590 nm. A p-AlGaP cladding layer was formed thereon, an upper electrode was provided via a p-type second light reflecting layer having the same structure as that of the first light reflecting layer, and a lower electrode was provided on the back of the substrate in the same manner as in Example 1.

A 0.5 μm-thick GaAs layer was formed as the uppermost layer so that a p-side ohmic contact could be easily made.

COMPARATIVE EXAMPLE 3

A semiconductor light emitting element was manufactured in the same manner as in Example 9 except that the second light reflecting layer was not formed.

EXAMPLES 10-12

Semiconductor light emitting elements were manufactured in the same manner as in Example 9 except that the first light reflecting layer was made to have a three-dimensional shape with a slope S, such as a gable roof (Example 10), a pyramid (Example 11), or a dome (Example 12).

The luminance of each element obtained was determined in the same manner as described above, the results of which are given in Table 3.

TABLE 3

|  | Shape of first light reflecting layer | luminance (mcd) |
| --- | --- | --- |
| Example 9 | plate | 22.2 |
| Comp.Ex. 3 | plate | 16.5 |
| Example 10 | gable roof | 23.8 |
| Example 11 | pyramid | 24.5 |
| Example 12 | dome | 22.6 |

As is evident from Table 3, the semiconductor light emitting element of Examples 9-12 showed about 50% increase in luminance as compared with that of Comparative Example 3.

EXAMPLE 13

The semiconductor light emitting element of this example had a DH-type structure and is shown in FIG. 3. In the semiconductor light emitting element H3, a GaAs buffer layer (not shown), an n-type first light reflecting layer 2 composed of laminated multiple pairs of an n-InGaP layer and an n-InAlP layer, an n-InGaAlP cladding layer 3, a non-doped InGaAlP active layer 4, a p-InGaAlP cladding layer 9, and a p-GaP layer 10 via a composition gradient layer (not shown) were sequentially formed on an n-GaAs substrate 1, with an upper electrode 6 made of AuBe being provided on the p-GaP layer 10, via a p-type second light reflecting layer 8 composed of multiple pairs of a p-GaP layer and a p-AlGaP layer laminated; a lower electrode 7 made of AuSn being provided on the back of the n-GaAs substrate 1.

The DH-type semiconductor light emitting element of this example was manufactured as in the following. A 0.5 $\mu$m-thick n-GaAs buffer layer was epitaxially grown on a 300 $\mu$m-thick n-GaAs substrate 1. Then, an n-type first light reflecting layer 2 composed of 25 pairs of an n-InGaP layer having a thickness of 38-44 nm and an n-InAlP layer having a thickness of 42-47 nm alternatively laminated, was formed. In a sequential manner, a 5 $\mu$m-thick n-InGaAlP cladding layer 3, a 0.8 $\mu$m-thick non-doped InGaAlP active layer 4, a 3 $\mu$m-thick p-InGaAlP cladding layer 9, and a 20 $\mu$m-thick p-GaP layer 10 via a 0.2 $\mu$m-thick composition gradient layer were formed on the first light reflecting layer 2. Furthermore, an upper electrode 6 was provided via a p-type second light reflecting layer 8 composed of 25 laminated pairs of a p-GaP layer having a thickness of 43-48 nm and a p-AlGaP layer having a thickness of 46-51 nm, and a lower electrode 7 was provided on the back of the substrate 1 in the same manner as in Example 1.

The composition of each layer had been adjusted such that it showed lattice match to GaAs and the light emitting part had a bandgap corresponding to 570 nm.

COMPARATIVE EXAMPLE 4

A semiconductor light emitting element was manufactured in the same manner as in Example 13 except that the second light reflecting layer was not formed.

EXAMPLES 14-16

Semiconductor light emitting elements were manufactured in the same manner as in Example 13 except that the first light reflecting layer was made to have a three-dimensional shape with a slope S, such as a gable roof (Example 14), a pyramid (Example 15), or a dome (Example 16).

The luminance of each element obtained was determined as described above, the results of which are given in Table 4.

TABLE 4

|  | Shape of first light reflecting layer | luminance (mcd) |
| --- | --- | --- |
| Example 13 | plate | 38.5 |
| Comp.Ex. 4 | plate | 25.3 |
| Example 14 | gable roof | 32.0 |
| Example 15 | pyramid | 31.9 |
| Example 16 | dome | 31.8 |

As is evident from Table 4, the semiconductor light emitting element of Examples 13-16 showed about 50% increase in luminance as compared with that of Comparative Example 4.

EXAMPLE 17

The semiconductor light emitting element of this example had the same DH-type structure as shown in FIG. 3. The semiconductor light emitting element differed from the element of Example 13 in that the laminated multiple pairs of an n-$ZnS_{0.07}Se_{0.93}$ layer and an n-$Zn_{0.87}Mg_{0.13}S_{0.07}Se_{0.98}$ layer were used as an n-type first light reflecting layer, and that there were sequentially formed thereon an n-$ZnS_{0.07}Se_{0.93}$ cladding layer, a non-doped ZnCdSe/ZnSSe multiple quantum-well structure active layer, a p-$ZnS_{0.07}Se_{0.93}$ cladding layer, and a p-ZnSe layer via a composition gradient layer. The semiconductor light emitting element of this structure emits light of a blue type.

The above-mentioned DH-type semiconductor light emitting element was manufactured as in the following. A 0.1 $\mu$m-thick n-GaAs buffer layer was epitaxially grown on a 350 $\mu$m-thick n-GaAs substrate by MBE. Then, the material gases for $ZnS_{0.07}Se_{0.93}$ and $Zn_{0.87}Mg_{0.13}S_{0.18}Se_{0.82}$ were alternatively supplied onto the substrate to form an n-type first light reflecting layer composed of 32 pairs of an n-$ZnS_{0.07}Se_{0.93}$ layer having a thickness of 41-47 nm and an n-$Zn_{0.87}Mg_{0.13}S_{0.18}Se_{0.82}$ layer having a thickness of 42-49 nm alternatively laminated. In a sequential manner, a 2 $\mu$m-thick n-$ZnS_{0.07}Se_{0.93}$ cladding layer, a 0.4 $\mu$m-thick non-doped ZnCdSe/ZnSe multiple quantum-well structure active layer, a 2 $\mu$m-thick p-$ZnS_{0.07}Se_{0.93}$ cladding layer, and a 3 $\mu$m-thick p-ZnSe layer via a 0.1 $\mu$m-thick composition gradient layer were formed thereon. An upper electrode was provided thereon via a p-type second light reflecting layer having the same structure as that of the first light reflecting layer, and a lower electrode was provided on the back of the substrate in the same manner as in Example 1.

COMPARATIVE EXAMPLE 5

A semiconductor light emitting element was manufactured in the same manner as in Example 17 except that the second light reflecting layer was not formed.

EXAMPLES 18-20

Semiconductor light emitting elements were manufactured in the same manner as in Example 17 except that the first light reflecting layer was made to have a three-dimensional shape with a slope S, such as a gable roof (Example 18), a pyramid (Example 19), or a dome (Example 20).

The luminance of each element obtained was determined in the same manner as described above, the results of which are given in Table 5.

TABLE 5

|  | Shape of first light reflecting layer | luminance (mcd) |
| --- | --- | --- |
| Example 17 | plate | 4.7 |
| Comp.Ex. 5 | plate | 3.2 |
| Example 18 | gable roof | 5.1 |
| Example 19 | pyramid | 5.9 |
| Example 20 | dome | 5.1 |

As is evident from Table 5, the semiconductor light emitting element of Examples 17–20 showed about 50% increase in luminance as compared with that of Comparative Example 5.

EXAMPLE 21

The semiconductor light emitting element of this example emits blue light as that of Example 17. The semiconductor light emitting element differed from that of Example 17 in that the laminated multiple pairs of an n-ZnSe layer and an n-MgS layer were used as light reflecting layers.

The above-mentioned DH-type semiconductor light emitting element was manufactured as in the following. A 0.5 μm-thick n-GaAs buffer layer was grown on a 350 μm-thick n-GaAs substrate by MBE. Then, a first light reflecting layer was formed by accumulating 15 laminated pairs of an n-ZnSe layer having a thickness of 37–44 nm and an n-MgS layer having a thickness of 39–46 nm. In a sequential manner, a 2 μm-thick n-$ZnS_{0.07}Se_{0.93}$ cladding layer, a 0.4 μm-thick non-doped ZnCdSe/ZnSSe multiple quantum-well structure active layer, a 2 μm-thick p-$ZnS_{0.07}Se_{0.93}$ cladding layer, and a 5 μm-thick p-ZnSe layer via a 0.05 μm-thick composition gradient layer were formed thereon. An upper electrode was provided thereon via a p-type second light reflecting layer having the same structure as that of the first light reflecting layer, and a lower electrode was provided on the back of the substrate in the same manner as in Example 1.

COMPARATIVE EXAMPLE 6

A semiconductor light emitting element was manufactured in the same manner as in Example 21 except that the second light reflecting layer was not formed.

EXAMPLES 22–24

Semiconductor light emitting elements were manufactured in the same manner as in Example 21 except that the first light reflecting layer was made to have a three-dimensional shape with a slope S, such as a gable roof (Example 22), a pyramid (Example 23), or a dome (Example 24).

The luminance of each element obtained was determined in the same manner as described above, the results of which are given in Table 6.

TABLE 6

|  | Shape of first light reflecting layer | luminance (mcd) |
| --- | --- | --- |
| Example 21 | plate | 5.2 |
| Comp.Ex. 6 | plate | 3.8 |
| Example 22 | gable roof | 6.2 |
| Example 23 | pyramid | 6.2 |
| Example 24 | dome | 5.5 |

As is evident from Table 6, the semiconductor light emitting element of Examples 21–24 showed about 50% increase in luminance as compared with that of Comparative Example 6.

What is claimed is:

1. A semiconductor light emitting element having a light output surface, comprising a semiconductor substrate having thereon a lower electrode, a pn junction, a first light reflecting layer disposed between the substrate and the pn junction, an upper electrode, and a second light reflecting layer disposed between the pn junction and the upper electrode, the second light reflecting layer being of lesser extent than the light output surface and being capable of substantially reflecting light heading toward the upper electrode.

2. The semiconductor light emitting element as claimed in claim 1, comprising, between the pn junction and the second light reflecting layer, a semiconductor layer having a bandgap wider than that of a light emitting layer formed by said pn junction.

3. The semiconductor light emitting element as claimed in claim 2, wherein the semiconductor layer having a wider bandgap is mainly composed of GaP.

4. The semiconductor light emitting element as claimed in claim 1, wherein the first and the second light reflecting layers are of a light interference type and respectively composed of laminated multiple pairs of two different kinds of compound semiconductors.

5. The semiconductor light emitting element as claimed in claim 1, wherein the pn junction has a double heterostructure wherein an active layer composed of a compound semiconductor is interposed between a first cladding layer composed of a first conductivity type compound semiconductor and a second cladding layer composed of a second conductivity type compound semiconductor.

6. The semiconductor light emitting element as claimed in claim 1, wherein the substrate is a GaAs substrate.

7. The semiconductor light emitting element as claimed in claim 4, wherein the light reflecting layer of a light interference type is composed of laminated multiple pairs of a GaAs layer and an AlGaAs layer.

8. The semiconductor light emitting element as claimed in claim 1, wherein the second light reflecting layer is provided adjacent to the upper electrode and has substantially the same plane size as the upper electrode.

9. The semiconductor light emitting element as claimed in claim 1, wherein the first light reflecting layer has a three-dimensional shape with a slope.

10. The semiconductor light emitting element as claimed in claim 1, wherein the pn junction is formed by an active layer interposed between a first cladding layer and a second cladding layer, wherein the first cladding layer, the active layer and the second cladding layer are formed from AlGaInP.

* * * * *

UNITED STATES PATENT AND TRADEMARK OFFICE
CERTIFICATE OF CORRECTION

PATENT NO.   : 5,414,281
DATED        : May 9, 1995
INVENTOR(S)  : Shinichi Watabe et al It is certified that error(s) appears in the above-identified patent and that said Letters Patent is hereby corrected as shown below:

Title page, item [21], in the Appln. No., change "111,508" to --111,500--.

Signed and Sealed this

Eighteenth Day of February, 1997

Attest:

BRUCE LEHMAN

*Attesting Officer*           *Commissioner of Patents and Trademarks*